(12) United States Patent
Lohokare et al.

(10) Patent No.: US 7,170,096 B2
(45) Date of Patent: Jan. 30, 2007

(54) ANTIMONIDE-BASED OPTICAL DEVICES

(75) Inventors: Saurabh Lohokare, Newark, DE (US); Dennis W. Prather, Landenberg, PA (US)

(73) Assignee: The University of Delaware, Newark, DE (US)

( * ) Notice: Subject to any disclaimer, the term of this patent is extended or adjusted under 35 U.S.C. 154(b) by 189 days.

(21) Appl. No.: 11/040,430

(22) Filed: Jan. 21, 2005

(65) Prior Publication Data

US 2006/0054918 A1    Mar. 16, 2006

Related U.S. Application Data

(60) Provisional application No. 60/538,561, filed on Jan. 23, 2004.

(51) Int. Cl.
*H01L 29/15* (2006.01)
*H01L 31/0256* (2006.01)

(52) U.S. Cl. .......... 257/76; 257/189; 257/201; 257/103; 257/E31.021

(58) Field of Classification Search .......... 257/76
See application file for complete search history.

(56) References Cited

U.S. PATENT DOCUMENTS 6,724,018 B2*   4/2004   Ando et al. .......... 257/186

\* cited by examiner

*Primary Examiner*—Tu-Tu Ho
(74) *Attorney, Agent, or Firm*—Connolly, Bove, Lodge & Hutz, LLP

(57) ABSTRACT

An optical device includes an antimonide-containing substrate, and an antimonide-containing n-doped layer provided on the substrate. The optical device further includes an antimonide-containing i-doped layer provided on the n-doped layer, an antimonide-containing p-doped layer provided on the i-doped layer, and an antimonide-containing $p^+$-doped layer provided on the p-doped layer.

10 Claims, 5 Drawing Sheets

ANTIMONIDE-BASED OPTICAL DEVICES

CLAIM FOR PRIORITY

The present application claims priority of U.S. Provisional Patent Application Ser. No. 60/538,561, filed Jan. 23, 2004, the disclosure of which being incorporated by reference herein in its entirety.

STATEMENT OF GOVERNMENT RIGHTS

The United States Government has a paid-up license in the present invention and the right in limited circumstances to require the patent owner to license others on reasonable terms as provided for by the terms of Contract No. MDA972-00-1-0023 awarded by Defense Advanced Research Project Agency (DARPA).

BACKGROUND OF THE INVENTION

A. Field of the Invention

The present invention relates generally to semiconductor-based optical devices, and, more particularly to antimonide-based optical devices.

B. Description of the Related Art

InGaAs/InP (Indium Gallium Arsenide/Indium Phosphide)-based optical devices for the 1550 nanometer (nm) operating wavelength have been primarily used in the past. Such optical devices include photodetectors, and devices for optical interconnect, fiber, free-space, and spectroscopy applications. Due to the success of such InGaAs/InP-base devices, little work has been done with antimonide-based optical devices. However, antimonide-based optical devices offer the capability of a high-bandwidth, low noise level products.

Thus, there is a need in the for art antimonide-based optical devices that provide high-bandwidth and low noise levels.

SUMMARY OF THE INVENTION

The present invention solves the problems of the related art by providing antimonide-based optical devices that demonstrate high-bandwidth, while operating at low-noise levels.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EMBODIMENTS OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1A:
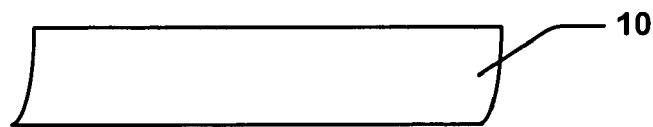
FIGS. 1(a)–1(f) are schematic side elevational views of the steps involved in fabricating an antimonide-based optical device in accordance with an embodiment of the present invention, the complete device being shown in FIG. 1(f)
Figure 1B:
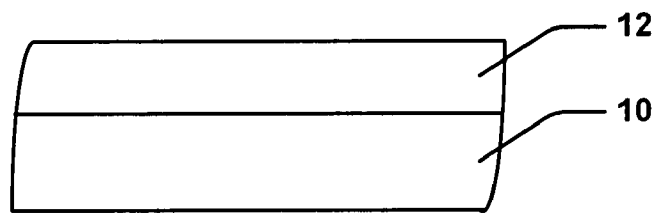
Figure 1C:
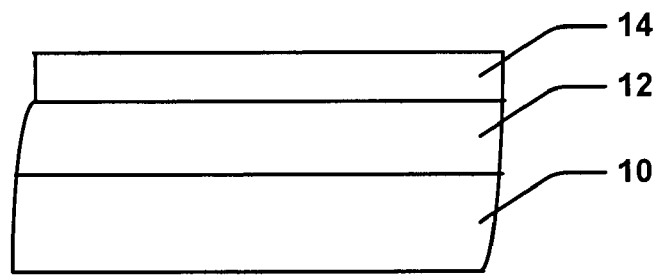
Figure 1D:
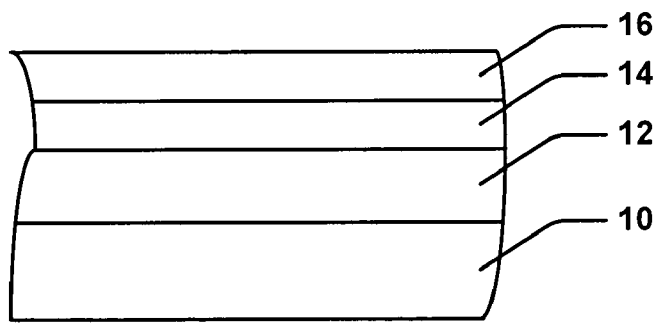
Figure 1E:
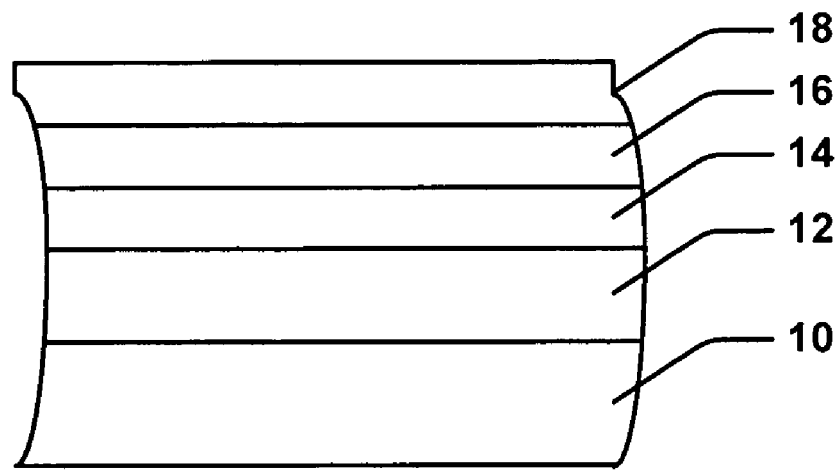
Figure 1F:
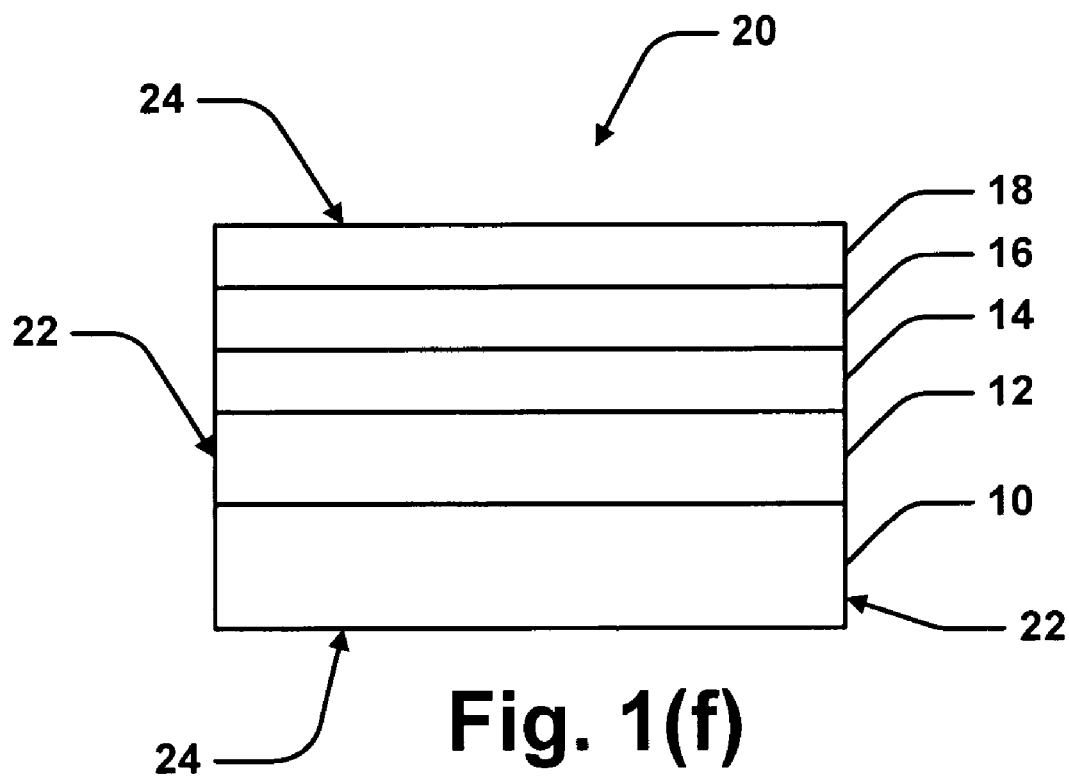

The present invention is broadly drawn to an antimonide-based optical device, as shown generally by reference numeral 20 in FIG. 1(f). Optical device 20 includes five layers which may be grown using molecular beam epitaxy. The steps of fabricating optical device 20 are shown in FIGS. 1(a)–1(f). In a first step, an n-doped GaSb (Gallium Antimonide) substrate 10 is provided, as shown in FIG. 1(a). The next step involves growing an n-doped AlGaAsSb (Aluminum Gallium Arsenide Antimonide) layer 12 on substrate 10, as shown in FIG. 1(b), using a molecular beam epitaxy process. The next step involves growing an i-doped AlGaAsSb (Aluminum Gallium Arsenide Antimonide) layer 14 on n-doped layer 12, as shown in FIG. 1(c), using a molecular beam epitaxy process. A p-doped AlGaAsSb (Aluminum Gallium Arsenide Antimonide) layer 16 is then grown on i-doped layer 14, as shown in FIG. 1(d), using a molecular beam epitaxy process. A $p^+$-doped GaSb (Gallium Antimonide) layer 18 is then grown on p-doped layer 16, as shown in FIG. 1(e), using a molecular beam epitaxy process. Finally, the surface and edges of optical device 20 are etched. Fabricating optical device 20 using dry etching techniques enables defect-free, smooth surfaces 22 and edge profiles 24, as shown in FIG. 1(f).

Although molecular beam epitaxy is disclosed as growing the layers the optical device 20, other semiconductor layering techniques may be used, including but not limited to metalorganic chemical vapor deposition (MOCVD), metalorganic vapor phase epitaxy (MOVPE), chemical beam epitaxy (CBE), atomic layer epitaxy, sputtering, etc.

The thicknesses and doping characteristics of the layers of optical device 20 may vary depending upon the application of optical device. By way example only and not limitation of the present invention: n-doped layer 12 may have a thickness of about 0.5 micrometers (μm); i-doped layer 14 may have a thickness of about 0.8 μm; p-doped layer 16 may have thickness of about 2 μm; and p$^+$-doped layer 18 may have a thickness of about 50 nanometers (nm). Conventional doping techniques may be used to dope layers of optical device 20. By way of example only and not limitation of the present invention, the doping characteristics of the layers of optical device 20 may be as follows: n-doped layer 12 may be doped with approximately $10^{18}$ ions/cm$^3$, i-doped layer 14 may be doped with approximately 2 to $3\times10^{16}$ ions/cm$^3$ at approximately 0.76 eV, p-doped layer 16 may be doped with approximately $10^{18}$ ions/cm$^3$ at approximately 0.85 eV, and p$^+$-doped layer 18 may be doped with approximately $2\times10^{19}$ ions/cm$^3$.

The use of AlGaAsSb as the active material enables production of high-speed and low-noise avalanche photodetectors as optical device 20. This is due to the essentially unipolar multiplication regime that can be established in these materials, due to a very high hole to electron ionization coefficient ratio. Also a bandgap resonance effect observed for a certain composition of this material can result in very high multiplication factors.

Optical device 20 of the present invention demonstrates a high gain-bandwidth, while still operating at low-noise levels. Optical device 20 may also incorporate coplanar contacts designed to offer 50Ω-input impedance, thereby obviating the need for bonding to external 50Ω coplanar or micro-strip waveguides for testing. Optical device 20 of the present invention achieves in excess of 10 GHz bandwidth and 60% external quantum efficiency at the 1550 nm wavelength. Optical device 20 may be used in a variety of applications, including but not limited to near-infrared free space optical communication, spectroscopy, and fiber systems.

Figure 2A:
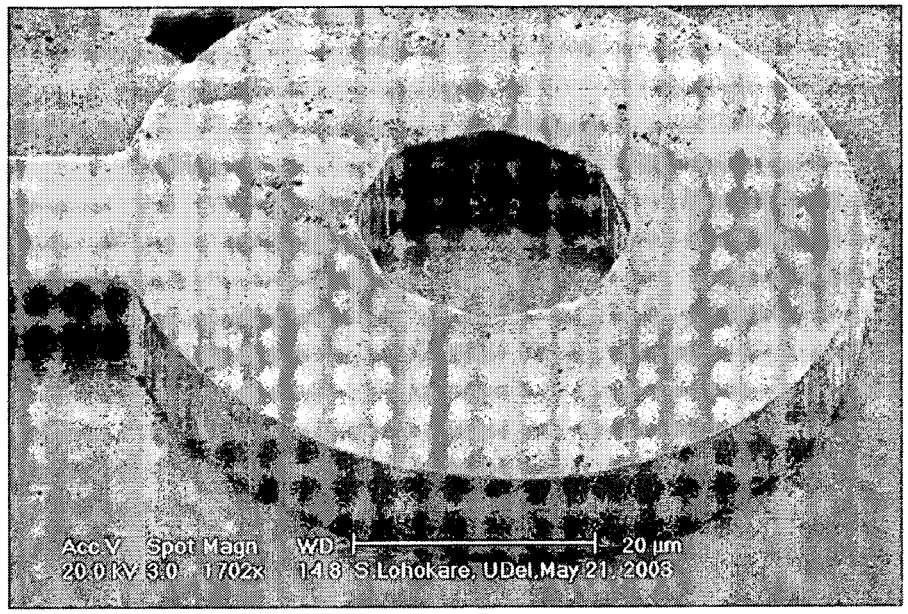
FIG. 2(a) is a photograph of an exemplary antimonide-based test structure in accordance with an embodiment of the present invention, wherein the test structure is etched in GaSb (Gallium Antimonide) using $Cl_2/SiCl_4$ chemistry, an AZ5214 mask, and an etch rate of 0.6 μm/min.
Figure 2B:
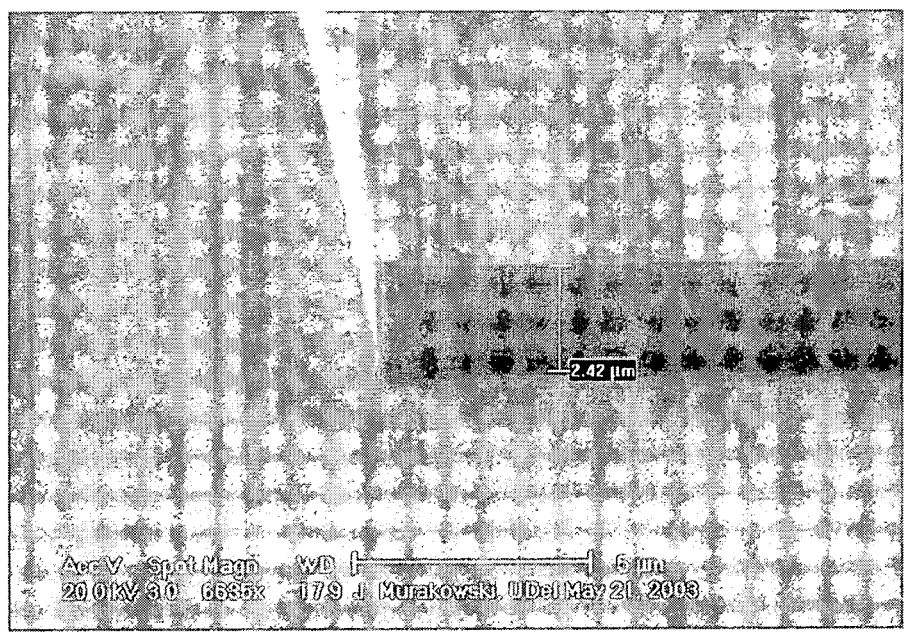
FIG. 2(b) is a photograph of an exemplary antimonide-based test structure in accordance with an embodiment of the present invention, wherein the test structure is etched in AlGaAsSb (Aluminum Gallium Arsenide Antimonide) using $Cl_2/SiCl_4$ chemistry, an AZ5214 mask, and an etch rate of 0.5 μm/min.

FIGS. 2(a) and 2(b) show results obtained after the etching of GaSb and AlGaAsSb using chlorine-based etch chemistry. While most compound semiconductor etching processes use nitride or oxide etch masks, the method of etching optical device 20 of the present invention employs a photoresist mask, which enables simpler and faster fabrication. The etch recipe may be characterized by a small total flow rate, high bias power, and low inductively coupled plasma (ICP) source power. Typically, a higher gas flow contributes to the formation of many radical species which causes sidewall etching. Hence, the lower flow rates enable ion etching (more anisotropic) rather than etching due to radicals or neutrals. The lower pressure increases the mean free path of the ions and reduces collisions, making the profile better. Also, the high bias power offers increased anisotropy of the etched profile. Increasing the ICP and bias power together can cause the total ion current to go up and the incident power on the sample to be very high, resulting in damage to the mask. Hence a medium plasma density with a lower ICP power is preferably used.

Figure 3:
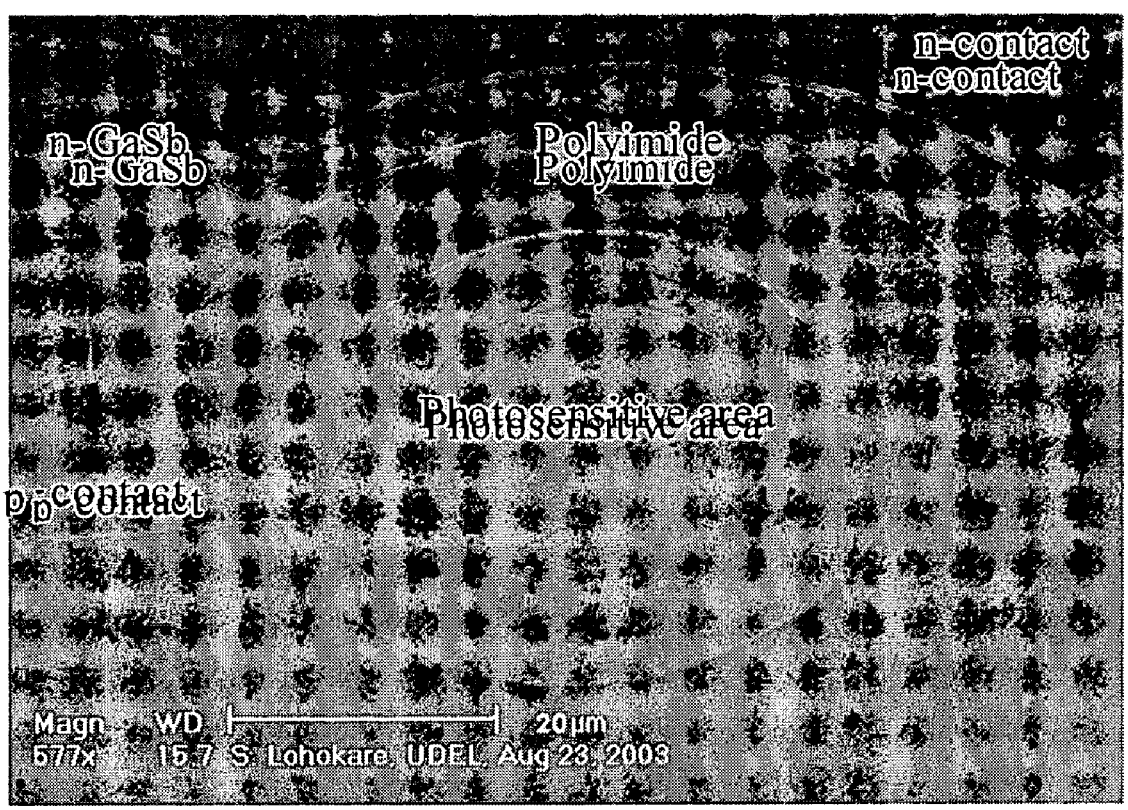
FIG. 3 is a photograph of an exemplary AlGaAsSb (Aluminum Gallium Arsenide Antimonide)/AlGaSb (Aluminum Gallium Antimonide) photodetector in accordance with an embodiment of the present invention.
Figure 4A:
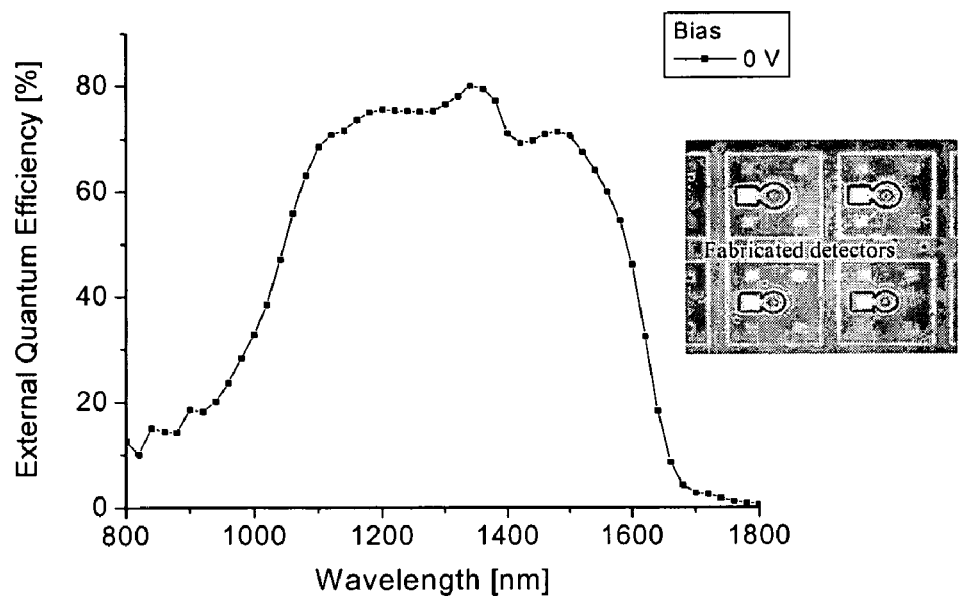
FIG. 4(a) is a graph showing the spectral response of the exemplary AlGaAsSb/AlGaSb photodetector shown in FIG. 3, and also showing the top view of coplanar waveguide structures fabricated on top of the photodetector.
Figure 4B:
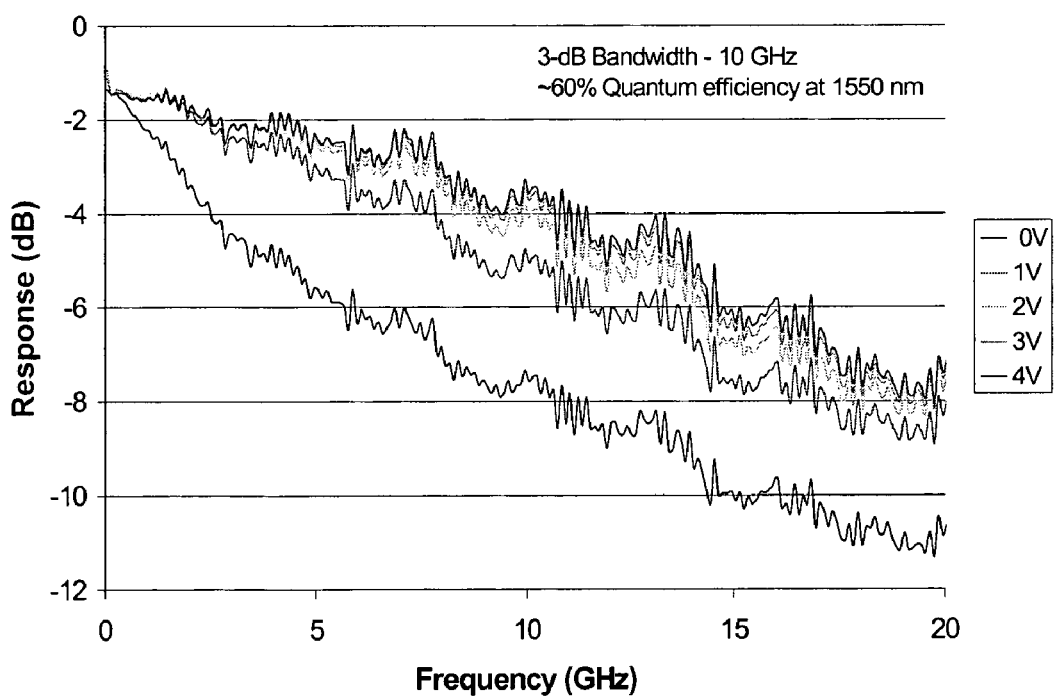
FIG. 4(b) is a graph showing the bandwidth characterization of the exemplary AlGaAsSb/AlGaSb photodetector shown in FIG. 3.

FIG. 3 shows a scanning electron microscope (SEM) photograph of an exemplary AlGaSb photodetector fabricated in accordance with the present invention. Spectral response and bandwidth characterization results for the photodetector of FIG. 3 are shown in FIGS. 4(a) and 4(b). FIG. 4(a) also shows the top view of coplanar waveguide structures fabricated on top of the photodetector to establish a 50Ω interface.

It will be apparent to those skilled in the art that various modifications and variations can be made in the antimonide-based optical devices of the present invention and in construction of the antimonide-based optical devices without departing from the scope or spirit of the invention, examples of which have been previously provided.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An optical device, comprising:
   an antimonide-containing substrate;
   an antimonide-containing n-doped layer provided on the substrate;
   an antimonide-containing i-doped layer provided on the n-doped layer;
   an antimonide-containing p-doped layer provided on the i-doped layer; and
   an antimonide-containing p$^+$-doped layer provided on the p-doped layer.

2. An optical device as recited in claim 1, wherein the n-doped layer, the i-doped layer, and the p-doped layer comprise aluminum, gallium, arsenide, and antimonide.

3. An optical device as recited in claim 1, wherein the substrate and the p$^+$-doped layer comprise gallium and antimonide.

4. An optical device as recited in claim 1, wherein the n-doped layer, i-doped layer, p-doped layer, and p$^+$-doped layer are formed on the substrate using molecular beam epitaxy.

5. An optical device as recited in claim 1, wherein the optical device is fabricated using dry etching.

6. A process for making an optical device, comprising:
   providing an antimonide-containing substrate;
   forming an antimonide-containing n-doped layer on the substrate;
   forming an antimonide-containing i-doped layer on the n-doped layer;
   forming an antimonide-containing p-doped layer on the i-doped layer; and
   forming an antimonide-containing p$^+$-doped layer on the p-doped layer.

7. A process for making an optical device as recited in claim 6, wherein the n-doped layer, the i-doped layer, and the p-doped layer comprise aluminum, gallium, arsenide, and antimonide.

8. A process for making an optical device as recited in claim 6, wherein the substrate and the p$^+$-doped layer comprise gallium and antimonide.

9. A process for making an optical device as recited in claim 6, wherein the n-doped layer, i-doped layer, p-doped layer, and p$^+$-doped layer are formed on the substrate using molecular beam epitaxy.

10. A process for making an optical device as recited in claim 6, wherein the optical device is fabricated using dry etching.

* * * * *